United States Patent
Woo

(10) Patent No.: US 7,176,101 B2
(45) Date of Patent: Feb. 13, 2007

(54) METHOD OF FORMING ISOLATION OXIDE LAYER IN SEMICONDUCTOR INTEGRATED CIRCUIT DEVICE

(75) Inventor: Hyuk Woo, Nam-gu (KR)

(73) Assignee: Dongbu Electronics, Seoul (KR)

( * ) Notice: Subject to any disclaimer, the term of this patent is extended or adjusted under 35 U.S.C. 154(b) by 0 days.

(21) Appl. No.: 11/320,591

(22) Filed: Dec. 30, 2005

(65) Prior Publication Data

US 2006/0148200 A1    Jul. 6, 2006

(30) Foreign Application Priority Data

Dec. 31, 2004    (KR) .................... 10-2004-0118483

(51) Int. Cl.
*H01L 21/76*    (2006.01)

(52) U.S. Cl. ............. 438/404; 438/413; 438/442; 257/E29.02

(58) Field of Classification Search ......... 438/400–454
See application file for complete search history.

(56) References Cited

U.S. PATENT DOCUMENTS 5,279,687 A * 1/1994 Tuppen et al. ............. 148/33.2

* cited by examiner

*Primary Examiner*—H. Jey Tsai
(74) *Attorney, Agent, or Firm*—Mayer Brown Rowe & Maw LLP

(57) ABSTRACT

A method is provided in which a first oxide layer is deposited on a silicon substrate and etched to form openings. A first silicon epitaxial layer is grown on the substrate in the openings, forming first active regions, a second oxide layer is deposited thereon, and the first and second oxide layers are etched such that the first oxide layer is wholly removed and the second oxide layer remains only on the first silicon epitaxial layer. A third oxide layer is thermally grown on entire resultant surfaces and then blanket-etched to remain only on sidewalls of the first silicon epitaxial layer. A second silicon epitaxial layer is grown on the exposed substrate between the first active regions, thus forming second active regions. The second oxide layer remaining on the first silicon epitaxial layer is removed. The first and second active regions are separated and electrically isolated by the third oxide layer.

7 Claims, 5 Drawing Sheets

METHOD OF FORMING ISOLATION OXIDE LAYER IN SEMICONDUCTOR INTEGRATED CIRCUIT DEVICE

This U.S. non-provisional application claims priority under 35 U.S.C. §119 from Korean Patent Application No. 10-2004-0118483, which was filed in the Korean Intellectual Property Office on Dec. 31, 2004, the contents of which are incorporated by reference herein in its entirety.

BACKGROUND OF THE INVENTION

1. Field of the Invention

The present invention relates generally to semiconductor integrated circuit fabrication technology and, more particularly, to a method of forming an isolation oxide layer in a semiconductor integrated circuit (IC) device.

2. Description of the Related Art

As is well known in the art, a semiconductor IC device employs in general a metal oxide semiconductor field effect transistor (MOSFET) as a unit transistor. Due to a reduced design rule and increased integration degree of the IC device, the size of the MOSFET also becomes smaller and smaller. Such a trend towards smaller MOSFET size may require a decrease in gate effective channel length and thereby invite several problems such as punch through phenomenon, short channel effect, etc.

In order to solve the above problems, various approaches have been introduced and studied in the art. One of them is a selective epitaxial growth (SEG) technique. For example, an anisotropic SEG technique has been widely used to form an epitaxial layer for elevated source/drain.

In a typical SEG process, an oxide layer is deposited on a silicon substrate and selectively etched to expose active regions of the silicon substrate. A silicon layer is then grown on the exposed regions of the silicon substrate. As a result, the silicon layer forms a number of active regions physically separated and electrically isolated by the oxide layer.

This isolation oxide layer may be formed traditionally by chemical vapor deposition (CVD) technique. However, the CVD oxide layer may have relatively poor layer quality such as integrity, uniformity, and defects, thereby causing a drop in isolation properties.

SUMMARY OF THE INVENTION

Exemplary, non-limiting embodiments of the present invention provide a method of forming an isolation oxide layer with improved layer quality and good isolation properties in a semiconductor integrated circuit (IC) device.

According to one exemplary embodiment of the present invention, the method comprises forming a first oxide layer on a silicon substrate, and selectively etching the first oxide layer until the silicon substrate is partly exposed, thereby forming a plurality of openings in the first oxide layer. Each opening defines a first active region. The method further comprises forming a first silicon epitaxial layer on the silicon substrate in the openings. The first silicon epitaxial layer forms a plurality of first active regions. The method also comprises forming a second oxide layer on both the first oxide layer and the first silicon epitaxial layer, and etching the second oxide layer and the first oxide layer such that the first oxide layer is wholly removed and the second oxide layer remains only on the first silicon epitaxial layer.

The method still further comprises thermally growing a third oxide layer on entire resultant surfaces, and blanket-etching the third oxide layer such that the third oxide layer remains only on sidewalls of the first silicon epitaxial layer. The silicon substrate is exposed between the adjacent first active regions formed by the first silicon epitaxial layer. The method also comprises forming a second silicon epitaxial layer on the exposed silicon substrate. The second silicon epitaxial layer forms a plurality of second active regions between the first active regions. And the method further comprises removing the second oxide layer remaining on the first silicon epitaxial layer. Accordingly, the first and second active regions are disposed one by one, being physically separated and electrically isolated by the third oxide layer.

In the method, the forming of the first and second oxide layers can use a chemical vapor deposition technique. The second oxide layer can have a smaller thickness than the first oxide layer.

In the method, the selectively etching of the first oxide layer can use a dry etch technique. And the forming of the first and second silicon epitaxial layers can use a selective epitaxial growth technique.

DETAILED DESCRIPTION OF EXEMPLARY EMBODIMENTS OF THE INVENTION

An exemplary, non-limiting embodiment of the present invention will now be described more fully hereinafter with reference to the accompanying drawings. This invention can, however, be embodied in many different forms and should not be construed as limited to the exemplary embodiment set forth herein. Rather, the disclosed embodiment is provided so that this disclosure will be thorough and complete, and will fully convey the invention to those skilled in the art. The principles and features of this invention can be employed in varied and numerous embodiments without departing from the scope of the invention.

In is noted that well-known structures and processes are not described or illustrated in detail to avoid obscuring the essence of the present invention. It is also noted that the figures are not drawn to scale. Rather, for simplicity and clarity of illustration, the dimensions of some of the elements are exaggerated relative to other elements.

FIGS. 1 to 9 are cross-sectional views showing a method of forming an isolation oxide layer in accordance with an exemplary embodiment of the present invention.

Figure 1:
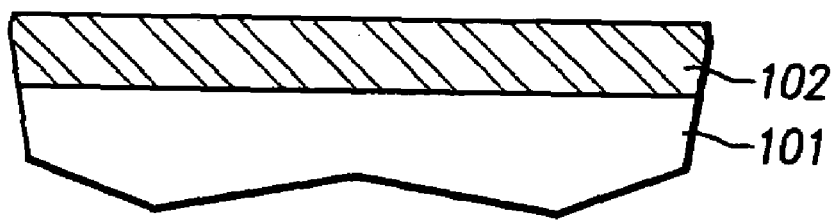
FIGS. 1 to 9 are cross-sectional views showing a method of forming an isolation oxide-layer in accordance with an exemplary embodiment of the present invention.

Referring to FIG. 1, a first oxide layer 102 is deposited on a silicon substrate 101. A traditional CVD technique can be used for deposition of the first oxide layer 102.

Figure 2:
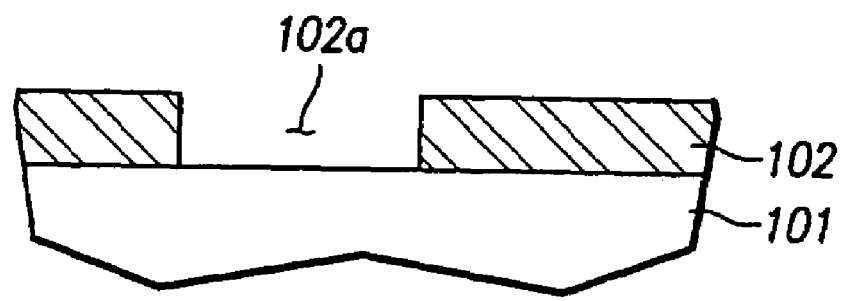

Next, as shown in FIG. 2, the first oxide layer 102 is selectively etched until the silicon substrate 101 is partly exposed. A plurality of openings 102a are therefore formed in the first oxide layer 102, each defining a first active region. A dry etch technique such as reactive ion etching (RIE) can be used for etching of the first oxide layer 102. The opening 102a is also referred to as a seed window for selective epitaxial growth (SEG) of silicon.

Figure 3:
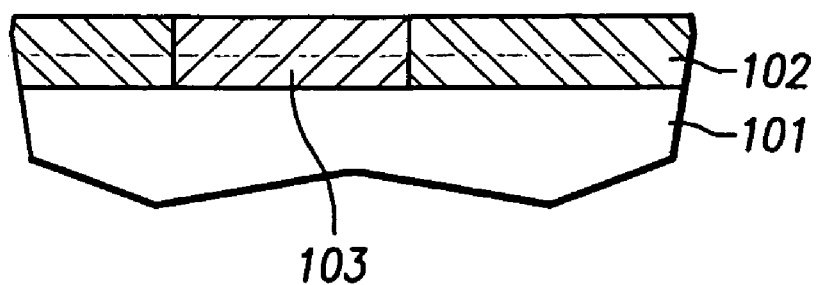

Next, as shown in FIG. 3, a first silicon epitaxial layer 103 is formed on the silicon substrate 101 in the openings 102a. An SEG technique is used for formation of the first silicon layer 103.

Figure 4:
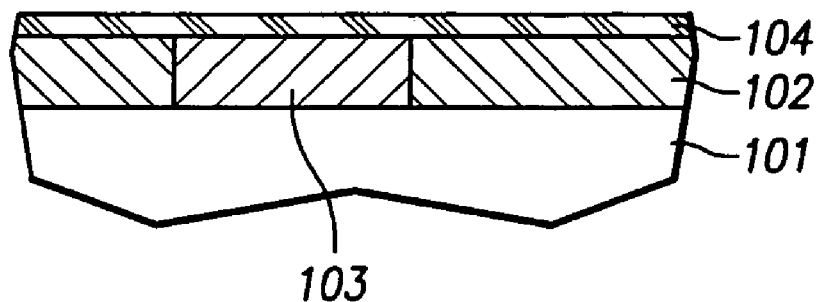

Next, as shown in FIG. 4, a second oxide layer 104 is deposited on both the first oxide layer 102 and the first silicon epitaxial layer 103. The second oxide layer 104 has a smaller thickness than the first oxide layer 102.

Figure 5:
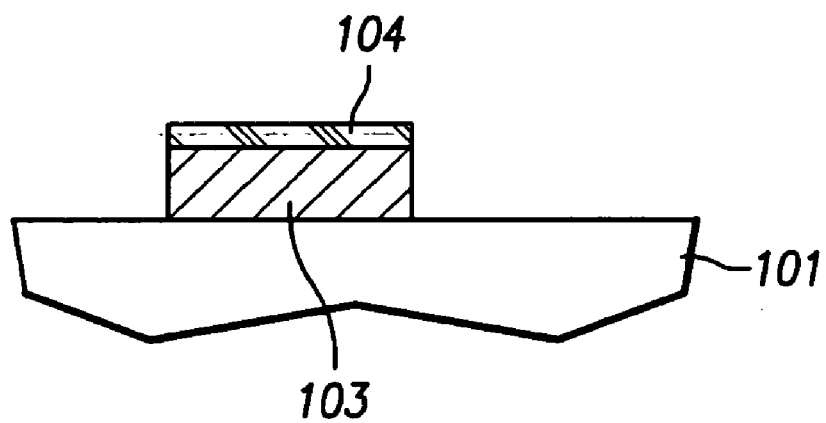

Next, as shown in FIG. 5, with a photoresist pattern (not shown) covering the first silicon epitaxial layer 103, the second oxide layer 104 and the underlying first oxide layer 102 are etched together by using dry etch technique, for example. So the first oxide layer 102 is wholly removed, and the second oxide layer 104 remains only on the first silicon epitaxial layer 103.

Figure 6:
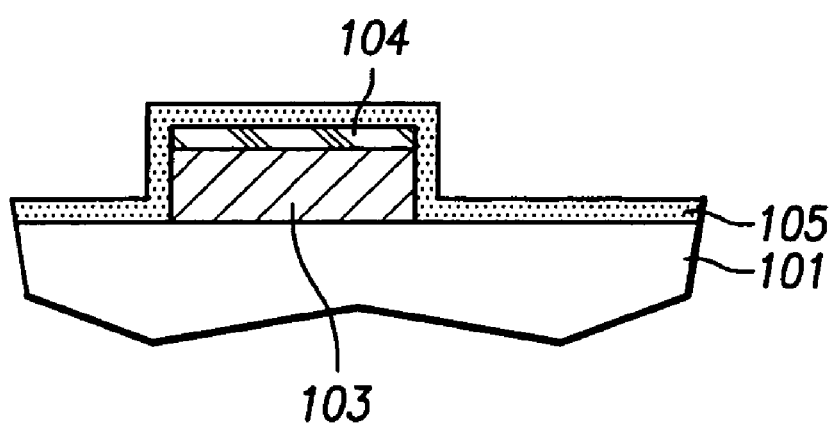

Next, as shown in FIG. 6, after the photoresist pattern is stripped, a third oxide layer 105 is thermally grown on the entire resultant surfaces. The thermally grown third oxide layer 105 has better layer quality such as higher integrity, higher uniformity, and less defects than CVD oxide layers.

Figure 7:
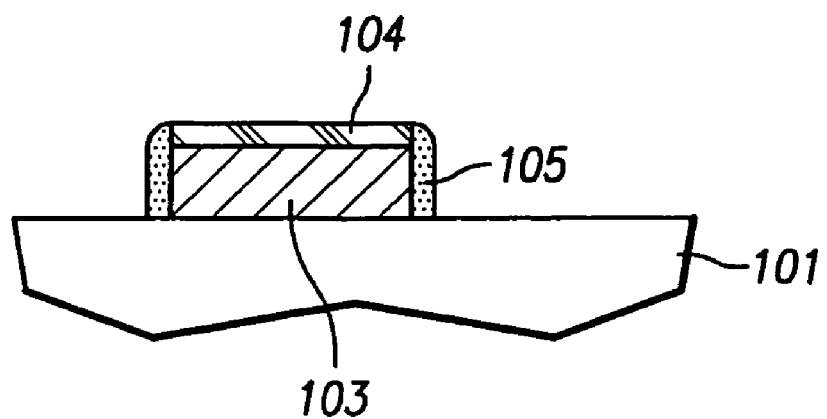

Next, as shown in FIG. 7, the third oxide layer 105 is blanket-etched by using a dry etch technique. So the third oxide layer 105 remains only on sidewalls of the first silicon epitaxial layer 103, and further, the silicon substrate 101 is exposed between the adjacent first active regions formed by the first silicon epitaxial layer 103.

Figure 8:
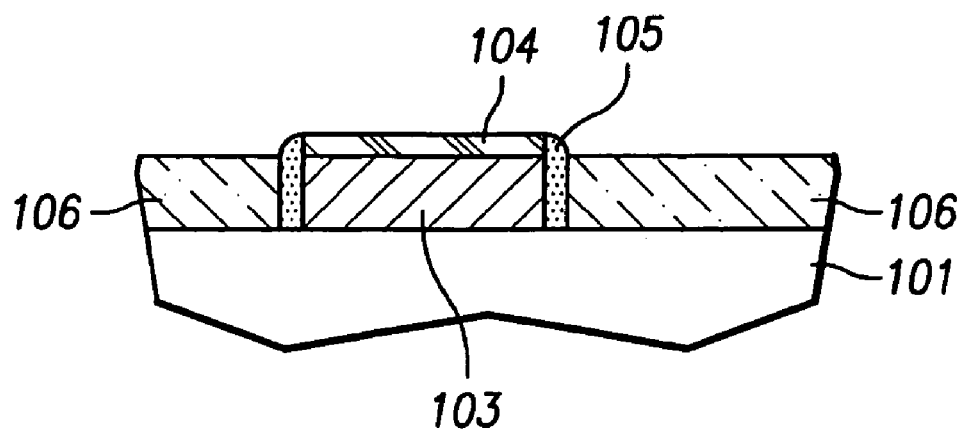

Next, as shown in FIG. 8, a second silicon epitaxial layer 106 is formed on the exposed silicon substrate 101 by using a SEG technique. The second silicon epitaxial layer 106 forms a plurality of second active regions between the first active regions.

Figure 9:
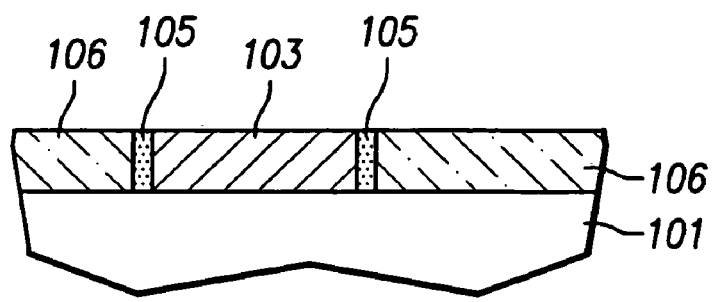

Finally, as shown in FIG. 9, the second oxide layer 104 remaining on the first silicon epitaxial layer 103 is completely removed.

Figure 10:
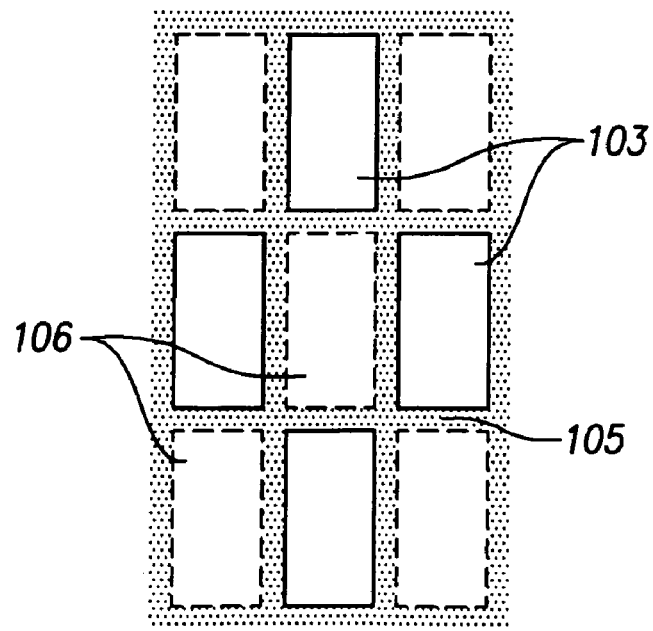
FIG. 10 is a plan view showing a layout example of active regions produced by the method shown in FIGS. 1 to 9.

FIG. 10 shows, in a plan view, a layout example of active regions produced by the method shown in FIGS. 1 to 9. As exemplarily shown in FIG. 10, the first active regions 103 and the second active regions 106 are disposed one by one, while being physically separated and electrically isolated by the third oxide layer 105.

As discussed above, the isolation oxide layer according to the present invention is formed by thermal oxidation technique. Therefore, the isolation oxide layer of the invention has more improved layer quality and better isolation property than conventional CVD isolation oxide layers.

While this invention has been particularly shown and described with reference to an exemplary embodiment thereof, it will be understood by those skilled in the art that various changes in form and details may be made therein without departing from the spirit and scope of the invention as defined by the appended claims.

What is claimed is:

1. A method of forming an isolation oxide layer, the method comprising:

forming a first oxide layer on a silicon substrate;

selectively etching the first oxide layer until the silicon substrate is partly exposed, thereby forming a plurality of openings in the first oxide layer, wherein each opening defines a first active region;

forming a first silicon epitaxial layer on the silicon substrate in the openings, wherein the first silicon epitaxial layer forms a plurality of first active regions;

forming a second oxide layer on both the first oxide layer and the first silicon epitaxial layer;

etching the second oxide layer and the first oxide layer such that the first oxide layer is wholly removed and the second oxide layer remains only on the first silicon epitaxial layer;

thermally growing a third oxide layer on entire resultant surfaces;

blanket-etching the third oxide layer such that the third oxide layer remains only on sidewalls of the first silicon epitaxial layer, wherein the silicon substrate is exposed between the adjacent first active regions formed by the first silicon epitaxial layer;

forming a second silicon epitaxial layer on the exposed silicon substrate, wherein the second silicon epitaxial layer forms a plurality of second active regions between the first active regions; and removing the second oxide layer remaining on the first silicon epitaxial layer, wherein the first and second active regions are disposed one by one, being physically separated and electrically isolated by the third oxide layer.

2. The method of claim 1, wherein the forming of the first oxide layer uses a chemical vapor deposition technique.

3. The method of claim 1, wherein the forming of the second oxide layer uses a chemical vapor deposition technique.

4. The method of claim 1, wherein the second oxide layer has a smaller thickness than the first oxide layer.

5. The method of claim 1, wherein the selectively etching of the first oxide layer uses a dry etch technique.

6. The method of claim 1, wherein the forming of the first silicon epitaxial layer uses a selective epitaxial growth technique.

7. The method of claim 1, wherein the forming of the second silicon epitaxial layer uses a selective epitaxial growth technique.

* * * * *